United States Patent
Xiao et al.

(10) Patent No.: US 9,634,045 B2
(45) Date of Patent: Apr. 25, 2017

(54) METHOD FOR FORMING THIN FILM PATTERN

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhilian Xiao, Beijing (CN); Haisheng Zhao, Beijing (CN); Xiaoguang Pei, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/099,409

(22) Filed: Apr. 14, 2016

(65) Prior Publication Data
US 2017/0018581 A1    Jan. 19, 2017

(30) Foreign Application Priority Data
Jul. 15, 2015    (CN) .......................... 2015 1 0417409

(51) Int. Cl.
*H01L 21/4763*    (2006.01)
*H01L 27/12*    (2006.01)
*H01L 21/02*    (2006.01)
*H01L 21/311*    (2006.01)
*H01L 21/3105*    (2006.01)

(52) U.S. Cl.
CPC ...... *H01L 27/1288* (2013.01); *H01L 21/0217* (2013.01); *H01L 21/31058* (2013.01); *H01L 21/31122* (2013.01); *H01L 21/31144* (2013.01); *H01L 27/124* (2013.01)

(58) Field of Classification Search
CPC ................................................ H01L 21/4763
See application file for complete search history.

(56) References Cited

U.S. PATENT DOCUMENTS 6,479,398 B1 *    11/2002    Chen ................ H01L 29/66765
                                                          257/E21.414

* cited by examiner

*Primary Examiner* — Marvin Payen
(74) *Attorney, Agent, or Firm* — Harness, Dickey & Pierce, P.L.C.

(57) ABSTRACT

The present disclosure provides a method for forming a thin film pattern. The method includes steps of: forming a mask pattern on a thin film in such a manner that the mask pattern includes a reserved portion corresponding to a region where the thin film pattern to be formed is located, and a partially-reserved portion neighboring the reserved portion; performing a wet-etching process to etch off a portion of the thin film which is not covered by the mask pattern; performing a dry etching process to remove the partially-reserved portion and thin the reserved portion; and performing a dry etching process to etch off a portion of the thin film which is not covered by the remaining mask pattern, so as to form the thin film pattern.

19 Claims, 4 Drawing Sheets

METHOD FOR FORMING THIN FILM PATTERN

CROSS REFERENCE OF RELATED APPLICATION

The present application claims a priority of Chinese patent application No. 201510417409.8 filed on Jul. 15, 2015, the disclosure of which is incorporated herein by reference in its entirety.

TECHNICAL FIELD

The present disclosure relates to the technical field of displaying, in particular to a method for forming thin film patterns.

BACKGROUND

In a market of displays, high-resolution displays are more and more popular for their fine display quality. A higher resolution display with a fixed display size requires metal lines therein to be thinner.

The metal lines are generally formed by a patterning process typically including: coating photoresist at a thin film; exposing the photoresist with a mask; washing out a portion of the photoresist to be removed with a developer solution; etching off a portion of the thin film which is not coated with the photoresist; and finally peeling off the remaining photoresist. Currently, the portion of the thin film which is not coated with the photoresist is usually etched off by a wet-etching process.

However, in practical production, as shown in FIG. 1, it is difficult to prevent dust 1 in an environment from entering an interface between the photoresist 2 and the metal film 3; or, as shown in FIG. 2, it is very likely that crack exists in a side of the photoresist 2. Then, during the wet-etching process, it is very likely that etching liquid flows into a region below the photoresist due to the presence of the dust or the crack, as a result, a portion of the metal film below the photoresist may be etched off.

Meanwhile, during the wet-etching process, the phenomenon of drill etching may appear due to the fact that capabilities in all directions are same for the wet etching process, i.e. etching is implemented in all directions at a same rate. When the etching liquid flows into the region below the photoresist due to the presence of the dust or the crack, the drill etching may intensify the etching of the portion of the metal film below the photoresist and enlarge an etching range.

As a matter of fact, the portion of the metal film below the photoresist should be remained. When the metal lines are etched by the wet-etching process, sizes of portions of the metal line may be smaller than a desired size of the metal line. As the desired size of the metal line is small, the portions of the metal line may be too thin or even be broken, therefore, the display device is degraded and even cannot work properly.

SUMMARY

An object of the present disclosure is to provide a method for forming a thin film pattern, so as to solve the problem that sizes of portions of a thin film pattern are thinner than a desired size caused by dust or crack in a side of photoresist when the thin film patter is formed by wet-etching process. Thus, when forming a metal line pattern in a display device, this method may prevent portions of the metal line from being too thin or even being broken, thereby improving quality of the display device.

For achieving the above object, the embodiments of present disclosure provides the following technical solutions.

In one aspect, the present disclosure provides in some embodiment a method for forming a thin film pattern, the method includes steps of: forming a mask pattern on a thin film in such a manner that the mask pattern includes a reserved portion corresponding to a region where the thin film pattern to be formed is located, and a partially-reserved portion neighboring the reserved portion; performing a wet-etching process to etch off a portion of the thin film which is not covered by the mask pattern; performing a dry etching process to remove the partially-reserved portion and thin the reserved portion; and performing a dry etching process to etch off a portion of the thin film which is not covered by the remaining mask pattern, so as to form the thin film pattern.

Further, the mask pattern is made of photoresist.

Further, the step of forming the mask pattern on the thin film includes: coating the photoresist at the thin film; and exposing and developing the photoresist, so as to form the mask pattern.

Further, the step of performing the dry etching process to remove the partially-reserved portion and thin the reserved portion includes: performing an ashing process to the mask pattern to remove the partially-reserved portion and thin the reserved portion.

Further, the mask pattern is made of silicon nitride.

Further, the step of forming the mask pattern on the thin film includes: forming the mask pattern on the thin film by a one-time patterning process.

Further, the thin film is a metal film.

Further, the thin film pattern to be formed is of a line shape.

Further, the thin film pattern to be formed is a gate line or a data line.

Further, the partially-remained portion surrounds the remained portion.

Further, after the step of performing the dry etching process to etch off the portion of the thin film which is not covered by the remaining mask pattern, the method further includes: peeling off the remaining mask pattern.

Further, the partially-reserved portion has a first thickness and the reserved portion has a second thickness, and the first thickness is less than the second thickness.

Further, the partially-reserved portion has a first thickness; the reserved portion includes a first reserved sub-portion of a second thickness and a second reserved sub-portion of a third thickness; the third thickness is greater than the first thickness and less than the second thickness.

Further, the second reserved sub-portion is between the first reserved sub-portion and the partially-reserved portion; a step structure is defined between the first reserved sub-portion and the second reserved sub-portion; a step structure is defined between the second reserved sub-portion and the partially-reserved portion.

Further, the thin film is an oxide film.

Further, the thin film is an indium tin oxide (ITO) film.

Further, the thin film pattern to be formed is a pixel electrode or a common electrode.

Further, the step of performing the dry etching process to etch off the portion of the thin film which is not covered by the remaining mask pattern includes: controlling parameters of the dry-etching process to enable an angle between a lateral side and a bottom of the formed thin film pattern to be in a range that is greater than or equal to 10 degrees and less than or equal to 70 degrees.

Further, the angle is of 20 degrees, 40 degrees or 60 degrees.

The present disclosure provides in some embodiment a method for forming a thin film pattern. The method includes steps of: forming a mask pattern on a thin film in such a manner that the mask pattern includes a reserved portion corresponding to a region where the thin film pattern to be formed is located, and a partially-reserved portion neighboring the reserved portion; using a wet-etching process to etch off a portion of the thin film which is not covered by the mask pattern; using a dry etching process to remove the partially-reserved portion and thin the reserved portion; and using a dry-etching process to etch off a portion of the thin film which is not covered by the remaining mask pattern, so as to form the thin film pattern.

When the portion of the thin film which is not covered by the remaining mask pattern is etched off by the wet-etching process, because the mask pattern includes the reserved portion corresponding to the region where the thin film pattern to be formed is located and the partially-reserved portion neighboring the reserved portion, thus, the portion of the thin film below the reserved portion may be protected by the portion of the thin film below the partially-reserved portion. This can effectively prevent the etching liquid from flowing into the region below the reserved portion due to the existence of the dust between the mask and the thin film or the crack in the side of the mask. Then, the partially-reserved portion is etching off and the reserved portion is thinned by the dry etching process, and the portion of the thin film which is not covered by the remaining mask pattern is etched off by the dry-etching process, so as to form the thin film pattern. In the dry-etching process, the etching is implemented by gas, so that the dust between the mask and the thin film has little effect on the dry-etching process. Furthermore, different from the etching liquid, it is difficult for the gas to flow into the region below the mask via the crack in the side of the mask; moreover, in the dry-etching process, the phenomenon of drill etching may not appear because the etchings are implemented in all directions at different rates, and even when trace amount of gas flows into the region below the mask, it may merely have a very limited effect. As a result, it may prevent the size of the portion of the thin film pattern from being thinner than the desired size caused by the dust or the crack in the side of the photoresist when the thin film patter is formed by the wet-etching process. As a result, it may prevent the portion of the metal line from being too thin or even being broken when a metal line pattern in the display device is formed, and thus the quality of the display device is improved.

BRIEF DESCRIPTION OF THE DRAWINGS

In order to illustrate the technical solutions of the present disclosure or the related art in a clearer manner, the drawings desired for the embodiments or the related art will be described briefly hereinafter. Obviously, the following drawings merely relate to some embodiments of the present disclosure, and based on these drawings, a person skilled in the art may obtain the other drawings without any creative effort.

REFERENCE SIGNS

1—dust; 2—photoresist; 3—metal film; 4—crack; 5—thin film; 51—region where a thin film pattern to be formed is located; 52—a lateral side of a thin film pattern etched by dry-etching process; 53—a bottom of the thin film pattern etched by dry-etching process; 6—mask pattern; 61—partially-reserved portion; 62—reserved portion; 621—first reserved sub-portion; 622—second reserved sub-portion.

DETAILED DESCRIPTION

In the following, it is clearly and completely described the technical solutions according to the embodiments of the present disclosure. It is obvious that the described embodiments are merely some of all the embodiments of the present disclosure instead of all the embodiments. All of other embodiments that those skilled in the art may implement based on the embodiments in the present disclosure without creative work should also fall within the scope of the present disclosure.

Figure 1:
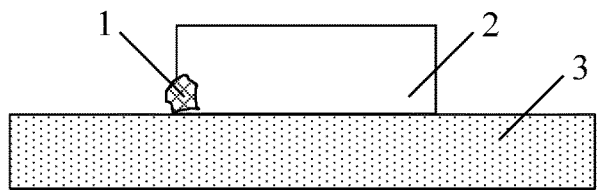
FIG. 1 is a schematic view showing dust between photoresist and a metal film according to the related art.
Figure 2:
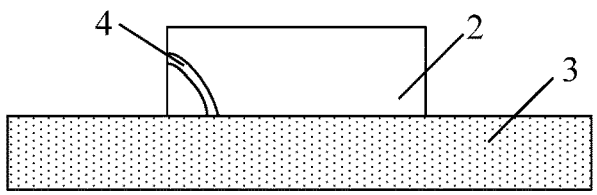
FIG. 2 is a schematic view showing a crack in a side of the photoresist according to the related art.
Figure 3:
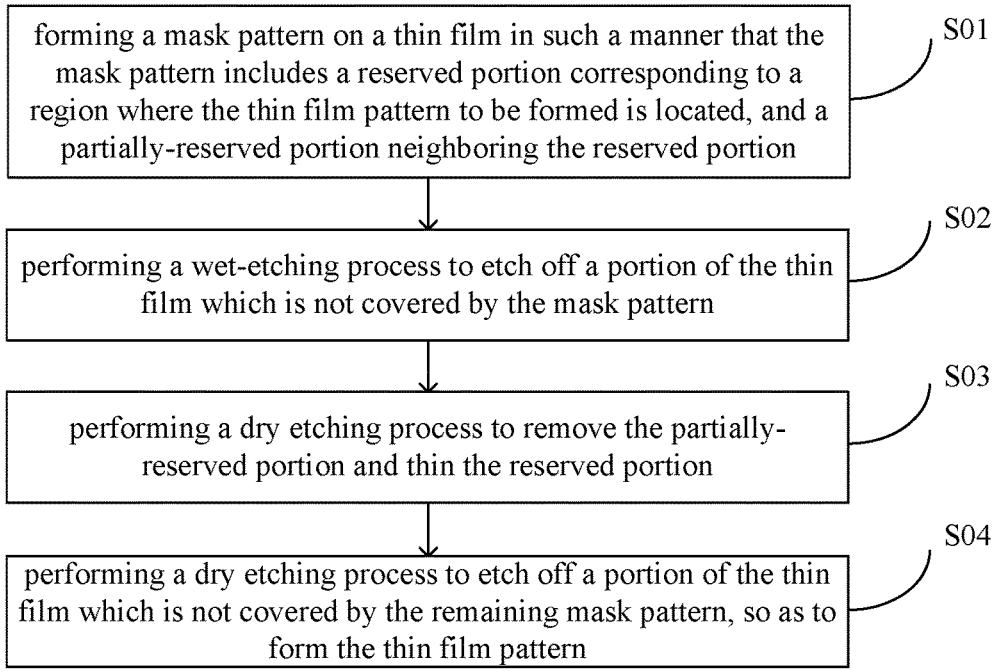
FIG. 3 is a flow chart showing a method for forming a thin film pattern according to one embodiment of the present disclosure.

The present disclosure provides in some embodiments a method for forming a thin film pattern. As shown in FIG. 3, the method includes the following steps S01~S04.

Figure 4:
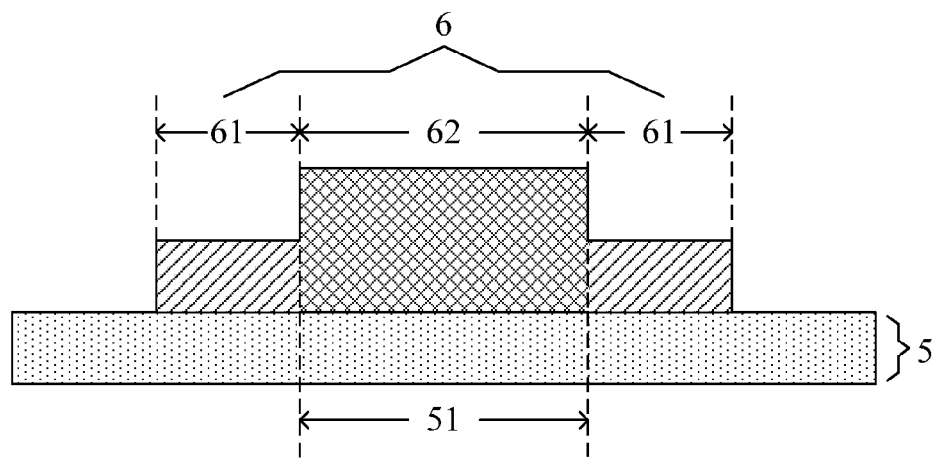
FIG. 4 is a schematic view showing a mask pattern formed on a thin film according to one embodiment of the present disclosure.

At step S01, referring also to FIG. 4, a mask pattern 6 is formed on a thin film 5. The mask pattern 6 includes a partially-reserved portion 61 and a reserved portion 62. The reserved portion 62 corresponds to a region 51 where a thin film pattern to be formed is located. The partially-reserved portion 61 neighbors the reserved portion 62.

Figure 5:
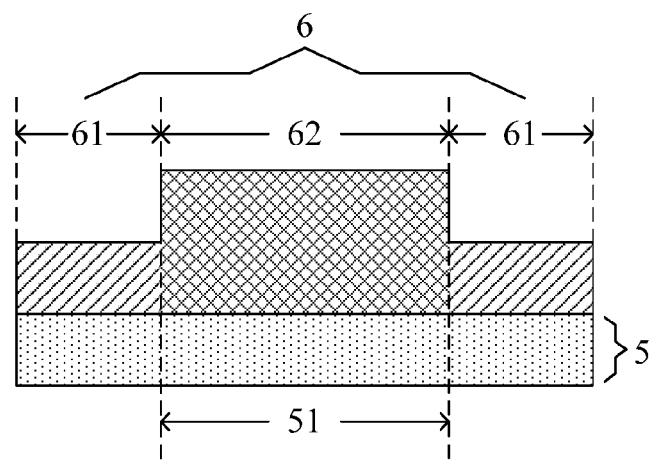
FIG. 5 is a schematic view of the thin film shown in FIG. 4 after being etched by a wet-etching process.

At step S02, a portion of the thin film 5 shown in FIG. 4, which is not covered by the mask pattern 6, is etched off by a wet-etching process, so as to obtain a thin film pattern as shown in FIG. 5.

Figure 6:
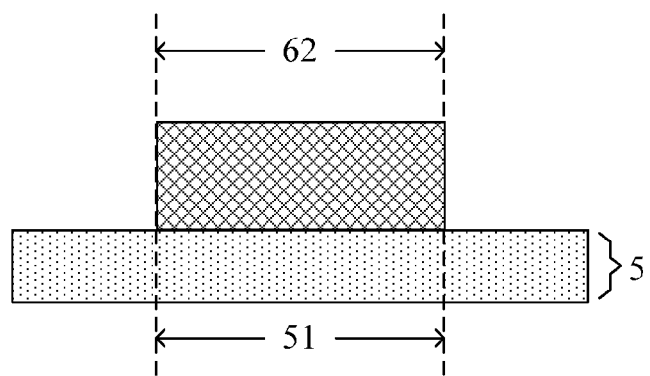
FIG. 6 is a schematic view of a structure obtained by removing a partially-reserved portion of the mask pattern of FIG. 5 and thinning a reserved portion of the mask pattern of FIG. 5.

At step S03, by a dry etching process, the partially-reserved portion 61 of the mask pattern 6 of FIG. 5 is removed, and the reserved portion 62 of the mask pattern 6 of FIG. 5 is thinned, so as to obtain a thin film pattern as shown in FIG. 6.

Figure 7:
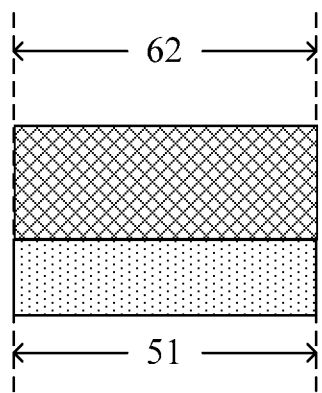
FIG. 7 is a schematic view of a structure obtained by performing a dry-etching process to etch off a portion of the thin film of FIG. 6 which is not covered by a remaining mask pattern.

At step S04, a portion of the thin film 5 of FIG. 6 which is not covered by a remaining mask pattern is etched off by a dry etching process, so as to form a thin film pattern as shown in FIG. 7.

It should be appreciated that, in the embodiments of the present disclosure, the thin film pattern to be formed may be of a shape of a line, a circle, a square or etc., which is not specifically defined herein and may be determined according to actual needs. Furthermore, the thin film pattern to be formed may be made of a metal, an alloy, or etc., and the thin film pattern to be formed may be a gate line or a data line for transmitting signals, an electrode such as a source electrode or a drain electrode for forming a thin film transistor (TFT), or etc., both of which are not specifically defined herein.

Moreover, in the embodiments of the present disclosure, the method for forming the mask pattern on the thin film is not specifically defined herein, and may be determined based on a material of the mask pattern. For example, when the mask pattern is made of photoresist, the method may include steps of: coating the photoresist at the thin film, and exposing and developing the photoresist, so as to form the mask pattern. Alternatively, when the mask pattern is made of silicon nitride, the mask pattern may be formed on the thin film through one-time patterning process. The one-time patterning process includes steps such as masking, exposing, developing, etching, peeling off, and etc.

Figure 11:
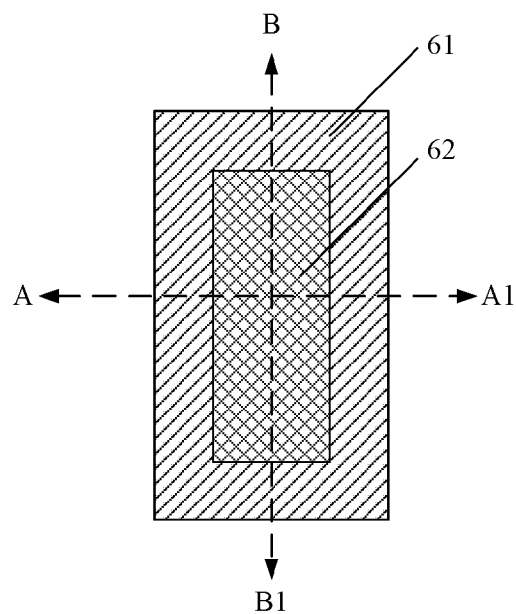
FIG. 11 is a schematic view showing a position relationship between the partially-reserved portion and the reserved portion of the mask pattern of FIG. 4.
Figure 12:
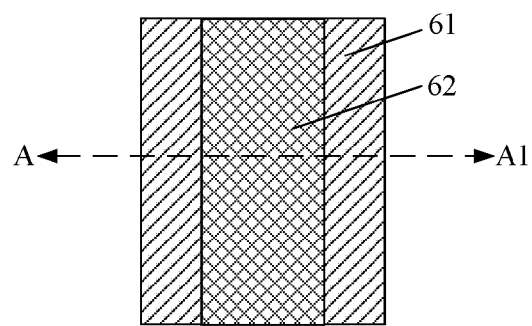
FIG. 12 is another schematic view showing a position relationship between the partially-reserved portion and the reserved portion of the mask pattern of FIG. 4.

In the above step S01, the partially-reserved portion neighboring the reserved portion means that the partially-reserved portion is in contact with the reserved portion, a contact region thereof is not specifically defined herein. For example, as shown in FIG. 11, the partially-reserved portion 61 may surround the reserved region 62. Alternatively, as shown in FIG. 12, the partially-reserved portion 61 may neighbor one or more parts of the reserved portion 62, which is not specifically defined herein. When the partially-reserved portion 61 surrounds the reserved region 62, the portion of the thin film below the reserved portion may be protected in a better manner. In addition, a thickness of the partially-reserved portion is different from a thickness of the reserved portion. In particular, the thickness of the partially-reserved portion is less than the thickness of the reserved portion, so as to facilitate formation of the thin film pattern sequentially.

In the above step S03, the method for removing the partially-reserved portion and thinning the reserved portion is not specifically defined herein, and may be determined based on a material of the mask pattern. For example, when the mask pattern is made of photoresist, the partially-reserved portion may be removed and the reserved portion may be thinned by an ashing process. When the mask pattern is made of the silicon nitride, the partially-reserved portion may be removed and the reserved portion may be thinned by the dry-etching process such as plasma bombardment.

Figure 8:
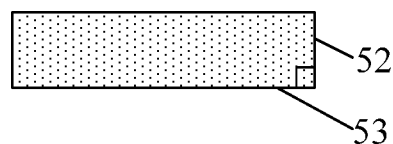
FIG. 8 is a schematic view showing a thin film according to one embodiment of the present disclosure.
Figure 9:
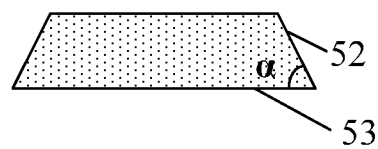
FIG. 9 is schematic view showing another thin film according to one embodiment of the present disclosure.

As shown in FIG. 8, a right angle may be formed between a lateral side 52 and a bottom 53 of the thin film pattern etched by the dry-etching process. As a result, when another film layer is formed on the thin film pattern, a portion of the another film layer corresponding to an edge of the thin film pattern may be broken due to a segment difference. To avoid this issue, in the dry-etching process of the above step S04, as shown in FIG. 9, parameters of the dry-etching process such as an etching duration and amount of etching gas may be determined, so as to enable the angle α between the lateral side 52 and the bottom 53 of the thin film pattern to satisfy 0ide 52°. For example, α may be 20 degrees, 40 degrees or 60 degrees.

The present disclosure provides in some embodiment a method for forming a thin film pattern. The method includes steps of: forming a mask pattern on a thin film in such a manner that the mask pattern includes a reserved portion corresponding to a region where the thin film pattern to be formed is located, and a partially-reserved portion neighboring the reserved portion; using a wet-etching process to etch off a portion of the thin film which is not covered by the mask pattern; using a dry etching process to remove the partially-reserved portion and thin the reserved portion; and using a dry-etching process to etch off a portion of the thin film which is not covered by the remaining mask pattern, so as to form the thin film pattern.

It can be seen from above that, when the portion of the thin film which is not covered by the remaining mask pattern is etched off by the wet-etching process, because the mask pattern includes the reserved portion corresponding to the region where the thin film pattern to be formed is located and the partially-reserved portion neighboring the reserved portion, thus, the portion of the thin film below the reserved portion may be protected by the portion of the thin film below the partially-reserved portion. This can effectively prevent the etching liquid from flowing into the region below the reserved portion due to the existence of the dust between the mask and the thin film or the crack in the side of the mask. Then, the partially-reserved portion is etching off and the reserved portion is thinned by the dry etching process, and the portion of the thin film which is not covered by the remaining mask pattern is etched off by the dry-etching process, so as to form the thin film pattern. In the dry-etching process, the etching is implemented by gas, so that the dust between the mask and the thin film has little effect on the dry-etching process. Furthermore, different from the etching liquid, it is difficult for the gas to flow into the region below the mask via the crack in the side of the mask; moreover, in the dry-etching process, the phenomenon of drill etching may not appear because the etchings are implemented in all directions at different rates, and even when trace amount of gas flows into the region below the mask, it may merely have a very limited effect. As a result, it may prevent the size of the portion of the thin film pattern from being thinner than the desired size caused by the dust or the crack in the side of the photoresist when the thin film patter is formed by the wet-etching process. As a result, it may prevent the portion of the metal line from being too thin or even being broken when a metal line pattern in the display device is formed, and thus the quality of the display device is improved.

In the following, the method for forming the thin film pattern is further explained with two examples in which mask patterns are made of different materials.

In the first example, the mask pattern is made of photoresist. In the related art, the mask pattern is usually made of photoresist. In both of the wet-etching process and the dry-etching process, the photoresist may be used to form the mask pattern, and thus has a wide scope for application.

When the mask pattern is made of photoresist, i.e., the mask pattern may also be referred as photoresist pattern.

Then, in the above step S01, the step of forming a mask pattern on a thin film includes steps of: coating the photoresist at the thin film; and exposing and developing the photoresist, so as to form the mask pattern.

Figure 10A:
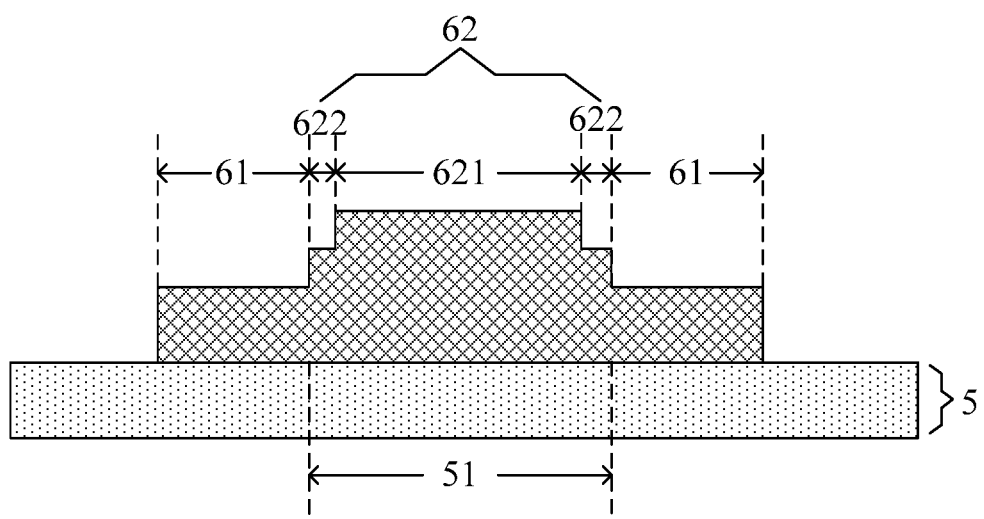
FIG. 10a is a schematic view showing another mask pattern formed on a thin film according to one embodiment of the present disclosure.

Further, when the photoresist pattern is shown in FIG. 4, the partially-reserved portion 61 and the reserved portion 62 may define a step structure therebetween. Alternatively, a plurality of step structures may be formed at the partially-reserved portion 61 and the reserved portion 62. As shown in FIG. 10a, the reserved portion 62 may include a first reserved sub-portion 621 and a second reserved sub-portion 622. The first reserved sub-portion 621 and the second reserved sub-portion 622 may define a step structure therebetween. The second reserved sub-portion 622 and the partially-reserved portion 61 may define a step structure therebetween. That is to say, the partially-reserved portion 61 and the reserved portion 62 may define two step structures.

Figure 10B:
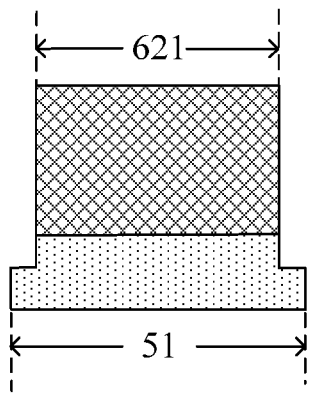
FIG. 10b is a schematic view showing a structure obtained by performing a dry-etching process to etch off a portion of the thin film below a partially-reserved portion of FIG. 10a according to one embodiment of the present disclosure.

Furthermore, when the photoresist pattern is shown in FIG. 10a, and when the portion of the thin film below the partially-reserved portion 61 of FIG. 10a is etched off by the dry-etching process, it is very likely that the second reserved sub-portion 622 is etched off if the second reserved sub-portion 622 has a thinner thickness. As a result, it is likely that a part of the portion of the thin film below the second reserved sub-portion 622 is etched off when the portion of the thin film below the partially-reserved portion 61 is etched off, thereby obtaining the thin film pattern as shown in FIG. 10b. Then, after the remaining photoresist is peeled off, the thin film pattern with one step structure is obtained. The step structure is defined at an edge of the thin film pattern, thereby preventing the other film layer formed on the thin film pattern from being broken which is caused by the segment difference of the edge after the dry-etching process. In the embodiments of the present disclosure, the number of step structures included in the photoresist pattern is not specifically defined. For example, the step structure shown in FIG. 10b may be selected to simplify the manufacture process.

The above step S03 of using the dry etching process to etch off the partially-reserved portion and thin the reserved portion includes: performing an ashing process to remove the partially-reserved portion and thin the reserved portion.

After the above step S04 of using the dry-etching process to etch off the portion of the thin film which is not covered by the remaining mask pattern so as to form the thin film pattern, the method further includes: peeling off the remaining mask pattern, so as to facilitate formation of other film layers in subsequent process. It should be appreciated that the remaining photoresist has to be totally removed to prevent it from burning and damaging the product because the manufacturing environment is usually in a high temperature.

In the second example, the mask pattern is made of silicon nitride. In either of the wet-etching process and the dry-etching process, it is needed to avoid selecting any etching liquid or plasma that is capable of having a chemical reaction with the silicon nitride, which limits the application scope of the silicon nitride as the material for the mask pattern.

When the mask pattern is made of the silicon nitride, the above step S01 of forming the mask pattern on the thin film includes: forming the mask pattern on the thin film by a one-time patterning process.

The above step S03 of using the dry etching process to etch off the partially-reserved portion and thin the reserved portion includes: performing a plasma bombardment process to the mask pattern to remove the partially-reserved portion and thin the reserved portion out.

It should be appreciated that, the silicon nitride may function as an insulation protective layer. Thus, when the thin film pattern to be formed is the metal line or the metal electrode, after the above step S04 of using the dry-etching process to etch off the portion of the thin film which is not covered by the remaining mask pattern so as to form the thin film pattern, it is not necessary to peel off the remaining silicon nitride; instead, the other film layer may be directly formed on the remaining silicon nitride. As compared with the above first example, the step of peeling off the remaining mask pattern can be eliminated.

Furthermore, although the mask pattern is made of the photoresist or the silicon nitride in the above embodiments, the present disclosure is not limited thereto. The mask pattern may be made of any material applicable in the wet-etching process and the dry-etching process, which is not specifically defined herein.

Optionally, the thin film may be a metal film, so as to form the thin film pattern such as the metal line or the metal electrode. For example, the metal line may be a gate line or a data line. Of course, the thin film may be made of oxide. For example, the thin film may be made of indium tin oxide (ITO), so as to form the pixel electrode or the common electrode. In the embodiments of the present disclosure, as an example, the thin film is the metal film, and the gate line or the data line is formed from the metal film.

Optionally, the thin film pattern to be formed may be of a line shape. It should be appreciated that, the shape of the thin film pattern to be formed may be determined based on a function of the thin film pattern. For example, when the thin film pattern to be formed is the gate line or the data line, the thin film pattern to be formed may be of the line shape; and when the thin film pattern to be formed is the electrode, the thin film pattern to be formed may be of a rectangular shape or a circle shape. In the above embodiments, as an example, the thin film pattern to be formed is in the line shape.

Optionally, in the above method, the partially-reserved portion surrounds the reserved portion, so as to effectively protect the portion of the thin film below the reserved portion. For example, as shown in FIG. 11, when the thin film pattern to be formed is the metal line of the line shape, the partially-reserved portion 61 surrounds the reserved portion 62, so both of a width of the metal line along the line A-A1 in FIG. 11 and a length of the metal line along the line B-B1 in FIG. 11 are not less than the desired sizes respectively. Alternatively, as shown in FIG. 12, the partially-reserved portion 61 may neighbor two opposite sides of the reserved portion 62, so the width of the metal line along the line A-A1 as shown in FIG. 12 is not less than the desired size.

Optionally, after the above step S04 of using the dry-etching process to etch off the portion of the thin film which is not covered by the remaining mask pattern, the method further includes: step S05 of peeling off the remaining mask pattern.

Furthermore, whether the step S05 is adopted may be determined based on the material of the mask pattern. For example, when the mask pattern is made of the photoresist, the step S05 may be adopted to facilitate formation of subsequent film layer; and when the mask pattern is made of the silicon nitride, whether the step S05 is adopted may be determined based on actual conditions, which is not further explained herein.

The above are merely embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure. Thus, a scope of the present disclosure is confined in claims.

What is claimed is:

1. A method for forming a thin film pattern comprising steps of:
    forming a mask pattern on a thin film in such a manner that the mask pattern comprises a reserved portion corresponding to a region where the thin film pattern to be formed is located, and a partially-reserved portion neighboring the reserved portion;
    performing a wet-etching process to etch off a portion of the thin film which is not covered by the mask pattern;
    performing a dry etching process to remove the partially-reserved portion and thin the reserved portion; and
    performing a dry etching process to etch off a portion of the thin film which is not covered by the remaining mask pattern, so as to form the thin film pattern.

2. The method according to claim 1, wherein the mask pattern is made of photoresist.

3. The method according to claim 2, wherein the step of forming the mask pattern on the thin film comprises:
    coating the photoresist at the thin film; and exposing and developing the photoresist, so as to form the mask pattern.

4. The method according to claim 2, wherein the step of performing the dry etching process to remove the partially-reserved portion and thin the reserved portion comprises: performing an ashing process to the mask pattern to remove the partially-reserved portion and thin the reserved portion.

5. The method according to claim 1, wherein the mask pattern is made of silicon nitride.

6. The method according to claim 5, wherein the step of forming the mask pattern on the thin film comprises: forming the mask pattern on the thin film by a one-time patterning process.

7. The method according to claim 1, wherein the thin film is a metal film.

8. The method according to claim 1, wherein the thin film pattern to be formed is of a line shape.

9. The method according to claim 8, wherein the thin film pattern to be formed is a gate line or a data line.

10. The method according to claim 8, wherein the partially-remained portion surrounds the remained portion.

11. The method according to claim 1, wherein after the step of performing the dry etching process to etch off the portion of the thin film which is not covered by the remaining mask pattern, the method further comprises: peeling off the remaining mask pattern.

12. The method according to claim 1, wherein the partially-reserved portion has a first thickness and the reserved portion has a second thickness, and the first thickness is less than the second thickness.

13. The method according to claim 1, wherein the partially-reserved portion has a first thickness; the reserved portion comprises a first reserved sub-portion of a second thickness and a second reserved sub-portion of a third thickness; the third thickness is greater than the first thickness and less than the second thickness.

14. The method according to claim 13, wherein the second reserved sub-portion is between the first reserved sub-portion and the partially-reserved portion; a step structure is defined between the first reserved sub-portion and the second reserved sub-portion; a step structure is defined between the second reserved sub-portion and the partially-reserved portion.

15. The method according to claim 1, wherein the thin film is an oxide film.

16. The method according to claim 15, wherein the thin film is an indium tin oxide (ITO) film.

17. The method according to claim 16, wherein the thin film pattern to be formed is a pixel electrode or a common electrode.

18. The method according to claim 1, wherein the step of performing the dry etching process to etch off the portion of the thin film which is not covered by the remaining mask pattern comprises: controlling parameters of the dry-etching process to enable an angle between a lateral side and a bottom of the formed thin film pattern to be in a range that is greater than or equal to 10 degrees and less than or equal to 70 degrees.

19. The method according to claim 18, wherein the angle is of 20 degrees, 40 degrees or 60 degrees.

* * * * *